US012772879B2

(12) United States Patent
Marin et al.

(10) Patent No.: US 12,772,879 B2
(45) Date of Patent: Oct. 20, 2026

(54) PACKAGE SUBSTRATE WITH EMBEDDED DIES IN BUILDUP LAYERS

(71) Applicant: Intel Corporation, Santa Clara, CA (US)

(72) Inventors: Brandon C. Marin, Gilbert, AZ (US); Kristof Kuwawi Darmawikarta, Chandler, AZ (US); Srinivas V. Pietambaram, Chandler, AZ (US); Gang Duan, Chandler, AZ (US); Benjamin T. Duong, Phoenix, AZ (US); Suddhasattwa Nad, Chandler, AZ (US); Jeremy Ecton, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 104 days.

(21) Appl. No.: 17/929,045

(22) Filed: Sep. 1, 2022

(65) Prior Publication Data

US 2024/0079339 A1 Mar. 7, 2024

(51) Int. Cl.
*H01L 23/498* (2006.01)
*G11C 5/06* (2006.01)
(Continued)

(52) U.S. Cl.
CPC ........... *H10W 70/65* (2026.01); *H10W 20/20* (2026.01); *H10W 70/05* (2026.01);
(Continued)

(58) Field of Classification Search
CPC ..... H01L 21/823475; H01L 21/823871; H01L 21/76885; H01L 21/76895; H01L 21/76897; H01L 21/76804; H01L 21/76805; H01L 21/76816; H01L 21/76877; H01L 23/5226; H01L 23/5283; H01L 23/5286; H01L 23/528; H01L 23/481; H01L 23/535; H01L 23/5384; H01L 23/5386; H01L 23/283157;
(Continued)

(56) References Cited

U.S. PATENT DOCUMENTS 11,335,642 B2 * 5/2022 Liff ......................... H01L 25/50
2021/0375773 A1 * 12/2021 Lee ..................... H01L 21/4853
(Continued)

*Primary Examiner* — Wael M Fahmy
*Assistant Examiner* — Aneesa Riaz Baig
(74) *Attorney, Agent, or Firm* — Akona IP PC

(57) ABSTRACT

Embodiments of a microelectronic assembly comprise: a package substrate including a first integrated circuit (IC) die embedded therein; and a second IC die coupled to the package substrate and conductively coupled to the first IC die by vias in the package substrate. The package substrate has a first side and an opposing second side, the second IC die is coupled to the first side of the package substrate, the first IC die is between the first side of the package substrate and the second side of the package substrate, the package substrate comprises a plurality of layers of conductive traces in an organic dielectric material, the first IC die is surrounded by the organic dielectric material of the package substrate, the vias are in the organic dielectric material between the first IC die and the first side of the package substrate, and the first IC die comprises through-substrate vias.

20 Claims, 7 Drawing Sheets

(51) Int. Cl.

| | |
|---|---|
| ***H01L 21/768*** | (2006.01) |
| ***H01L 23/00*** | (2006.01) |
| ***H01L 23/495*** | (2006.01) |
| ***H10B 51/10*** | (2023.01) |
| ***H10B 51/20*** | (2023.01) |
| ***H10D 30/01*** | (2025.01) |
| ***H10D 30/47*** | (2025.01) |
| ***H10D 30/67*** | (2025.01) |
| ***H10D 62/10*** | (2025.01) |
| ***H10D 62/85*** | (2025.01) |
| ***H10D 64/01*** | (2025.01) |
| ***H10D 64/64*** | (2025.01) |
| ***H10H 20/852*** | (2025.01) |
| ***H10H 20/857*** | (2025.01) |
| ***H10P 14/20*** | (2026.01) |
| ***H10W 20/20*** | (2026.01) |
| ***H10W 70/05*** | (2026.01) |
| ***H10W 70/60*** | (2026.01) |
| ***H10W 70/65*** | (2026.01) |
| ***H10W 72/00*** | (2026.01) |
| ***H10W 72/20*** | (2026.01) |
| ***H10W 72/90*** | (2026.01) |
| ***H10W 74/01*** | (2026.01) |
| ***H10W 74/10*** | (2026.01) |
| ***H10W 74/15*** | (2026.01) |
| ***H10W 90/00*** | (2026.01) |

(52) U.S. Cl.

CPC .......... *H10W 70/611* (2026.01); *H10W 72/20* (2026.01); *H10W 74/012* (2026.01); *H10W 74/114* (2026.01); *H10W 74/15* (2026.01); *H10W 90/00* (2026.01); *H10W 72/01235* (2026.01); *H10W 72/072* (2026.01); *H10W 72/07236* (2026.01); *H10W 72/073* (2026.01); *H10W 72/07338* (2026.01); *H10W 72/241* (2026.01); *H10W 72/877* (2026.01); *H10W 72/942* (2026.01); *H10W 72/944* (2026.01); *H10W 90/724* (2026.01); *H10W 90/734* (2026.01)

(58) Field of Classification Search

CPC ..... H01L 23/3121; H01L 2224/73204; H10W 70/65; H10W 70/05; H10W 70/611; H10W 72/20; H10W 74/012; H10W 74/114; H10W 74/15; H10W 90/00; H10W 20/20; H10W 72/01235; H10W 72/072; H10W 72/07236; H10W 72/073; H10W 72/07338; H10W 72/241; H10W 72/877; H10W 72/942; H10W 72/944; H10W 90/724; H10W 90/734; H10W 99/00; H10W 70/614; H10W 70/635; H10W 70/685; H10W 74/01; H10W 74/117

See application file for complete search history.

(56) References Cited

U.S. PATENT DOCUMENTS

| | | | | |
|---|---|---|---|---|
| 2021/0391272 | A1* | 12/2021 | Tsai | H01L 25/50 |
| 2022/0199539 | A1* | 6/2022 | Karhade | H01L 24/13 |
| 2022/0230964 | A1* | 7/2022 | Liff | H01L 23/5389 |
| 2022/0375866 | A1* | 11/2022 | Pietambaram | H01L 23/5384 |
| 2023/0057113 | A1* | 2/2023 | Tsai | H01L 23/49822 |
| 2023/0060716 | A1* | 3/2023 | Wu | H01L 24/20 |
| 2023/0197679 | A1* | 6/2023 | Ecton | H01L 24/14 257/668 |
| 2023/0317653 | A1* | 10/2023 | Feng | H01L 24/08 257/97 |
| 2023/0378047 | A1* | 11/2023 | Sowwan | H01L 21/486 |

* cited by examiner

PACKAGE SUBSTRATE WITH EMBEDDED DIES IN BUILDUP LAYERS

TECHNICAL FIELD

The present disclosure relates to techniques, methods, and apparatus directed to package substrates with embedded bridge dies.

BACKGROUND

Electronic circuits when commonly fabricated on a wafer of semiconductor material, such as silicon, are called integrated circuits (ICs). The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system, or servers, such as mainframes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
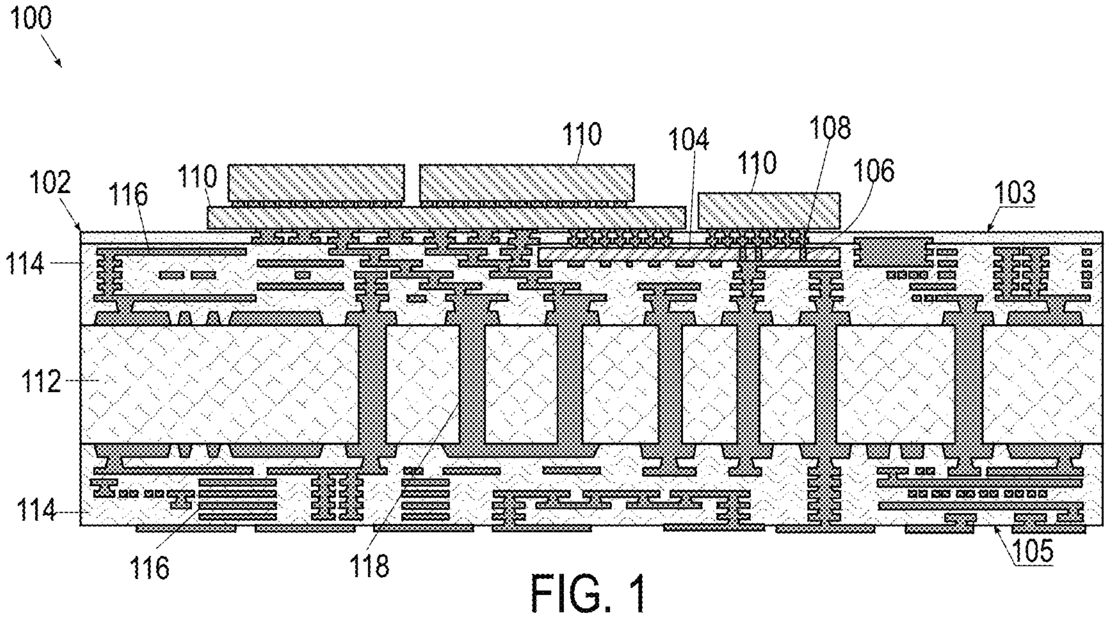
FIG. 1 is a schematic cross-sectional views of an example microelectronic assembly according to some embodiments of the present disclosure.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in any way to limit the broad scope of the present disclosure and its potential applications.

As Moore's law nears its natural limits, supercomputing faces inherent physical problems in moving toward zettascale systems. Zettascale computing aims to create 1000× the current level of compute today in or around the latter half of the decade, to take advantage of high demand for computational resources by both consumers and businesses, and to implement data hungry applications, such as artificial intelligence, machine learning and such. Zettascale supercomputers are targeted to have computing performance in the order of one zettaflops. One zettaflops equals one thousand exaflops, or one sextillion floating point operations per second. Despite advances in semiconductor processing and logic design that have permitted an increase in the amount of logic circuits that may be included in processors and other IC devices, signal speeds reach physics-based bottlenecks to achieve zettascale performance, for example, from the inherent limitations of the materials used for signal propagation, such as copper in a dielectric medium, heat transfer challenges from high intensity computations, and power delivery constraints to power several thousand simultaneous computations in multiple processors.

Many processors used in current supercomputers and other processing devices already have multiple cores that are monolithically integrated on a single die. Generally, these types of monolithic ICs are also described as planar since they take the form of a flat surface and are typically built on a single silicon wafer made from a monocrystalline silicon boule. The typical manufacturing process for such monolithic ICs is called a planar process, allowing photolithography, etching, heat diffusion, oxidation, and other such processes to occur on the surface of the wafer, such that active circuit elements (e.g., transistors and diodes) are formed on the planar surface of the silicon wafer. Current technologies permit hundreds and thousands of such active circuit elements to be formed on a single die so that numerous logic circuits may be enabled thereon. In such monolithic dies, the manufacturing process must be optimized for all the circuits equally, resulting in trade-offs between different circuits. In addition, because of the limitation of having to place circuits on a planar surface, some circuits are farther apart from some others, resulting in decreased performance such as longer delays. The manufacturing yield may also be severely impacted because the entire die may have to be discarded if even one circuit is malfunctional.

Consequently, the trend in the processor industry is to move toward disaggregation, using multiple known good chiplets (smaller sized IC dies) made using different manufacturing technologies and assembling them together into one microprocessor using novel bonding techniques. The smaller dies are part of an assembly of interconnected dies that together form a complete IC in terms of application and/or functionality, such as a memory chip, microprocessor, microcontroller, commodity IC (e.g., chip used for repetitive processing routines, simple tasks, application specific IC, etc.), and system-on-a-chip (SOC). In other words, the individual dies are connected to create the functionalities of a monolithic IC. By using separate dies, each individual die can be designed and manufactured optimally for a particular functionality. For example, a processor core that contains logic circuits might aim for performance, and thus might require a very speed-optimized layout. This has different manufacturing requirements compared to a USB controller, which is built to meet certain universal serial bus (USB) standards, rather than for processing speed. Thus, by having different parts of the overall design separated into different dies, each one optimized in terms of design and manufacturing, the overall yield and cost of the combined die solution may be improved.

The connectivity between these dies is achievable by many ways. For example, in 2.5D packaging solutions, a silicon interposer and through-silicon vias (TSVs) connect dies at silicon interconnect speed in a minimal footprint. In another example, a silicon bridge embedded under the edges of two interconnecting dies facilitates electrical coupling between them. In a three-dimensional (3D) architecture, the dies are stacked one above the other, creating a smaller footprint overall. Typically, the electrical connectivity and mechanical coupling in such 3D architecture is achieved using TSVs and high pitch solder-based bumps (e.g., C2 interconnections). The bridge and the 3D stacked architecture may also be combined to allow for top-packaged chips to communicate with other chips horizontally using the bridge and vertically, using Through-Mold Vias (TMVs) which are typically larger than TSVs. However, these current interconnect technologies use solder or its equivalent for connectivity, with consequent low vertical and horizontal interconnect density. Such solder-based packaging architecture also suffers from higher power consumption compared to on-die interconnects, increased cost to support assembly at fine pitches, and no room for error in manufacturing.

Further, in conventional 2.5D organic package architecture, bridge dies with lateral conductive pathways are provided in an organic interposer underneath two adjacent compute dies; in such package architecture, the bridge dies are between the compute dies and the package substrate, effectively reducing the area available for direct interconnections between the compute dies and the package substrate. To enable 3D organic package architecture that allows the compute dies to have direct coupling with the package substrate, the bridge dies in the interposer will need TSVs therethrough; however, assembling bridge dies with TSVs in the organic interposer has various challenges, for example, with aligning the TSVs with bond pads inside a recess in the organic interposer, or with soldering bridge dies inside the recess, among other disadvantages. While inorganic interposers can solve such challenges, they are more costly than organic packages. Further, simply moving the bridge dies to the "top" of the compute dies in organic packages is not without challenges either, because organic packages, by the inherent material properties of the organic materials used therein, such as shrinkage, high coefficient of thermal expansion, etc., are not amenable to enabling fine pitch interconnections between stacked layers of IC dies. In other words, using conventional manufacturing techniques, it is not possible to stack IC dies using interconnects that have pitches less than 60 micrometers between adjacent interconnects in an organic interposer.

Accordingly, embodiments described herein enable a microelectronic assembly comprising a package substrate including a first IC die embedded therein and a second IC die coupled to the package substrate and conductively coupled to the first IC die by vias in the package substrate, the vias having diameters of less than 60 micrometers. The package substrate has a first side and an opposing second side, the second IC die is coupled to the first side of the package substrate, the first IC die is between the first side of the package substrate and the second side of the package substrate, the package substrate comprises a plurality of layers of conductive traces in an organic dielectric material, the first IC die is surrounded by the organic dielectric material of the package substrate, the vias are in the organic dielectric material between the first IC die and the first side of the package substrate, and the first IC die comprises through-substrate vias.

Various embodiments of a package substrate disclosed herein comprise a core, buildup layers on either side of the core, and an IC die embedded in one of the buildup layers. Each buildup layer comprises a plurality of layers of conductive traces in an organic dielectric material. A subset of the conductive traces between a surface of the package substrate and the core comprises bond pads. The IC die is coupled to the bond pads by solder.

Embodiments disclosed herein further include a method comprising: providing a package substrate having a plurality of layers of conductive traces in a first organic dielectric material, forming first conductive vias through the first organic dielectric material between a first surface of the package substrate and a subset of the conductive traces; patterning first bond pads on the first surface of the package substrate, the first bond pads aligned with the first conductive vias; attaching an IC die to the bond pads with solder, the IC die comprising second bond pads on one side and third bond pads on an opposing side, the second bond pads being attached to the first bond pads with solder; depositing underfill material around the solder between the IC die and the first surface of the package substrate; depositing a second organic dielectric material over the first surface of the package substrate and the IC die, generating a second surface of the package substrate corresponding to a surface of the second organic dielectric material; forming second conductive vias between the second surface of the package substrate and the third bond pads of the IC die; and patterning fourth bond pads over the second surface of the package substrate, the fourth bond pads aligned with the second conductive vias.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art.

The terms "circuit" and "circuitry" mean one or more passive and/or active electrical and/or electronic components that are arranged to cooperate with one another to provide a desired function. The terms also refer to analog circuitry, digital circuitry, hard wired circuitry, programmable circuitry, microcontroller circuitry and/or any other type of physical hardware electrical and/or electronic component.

The term "integrated circuit" means a circuit that is integrated into a monolithic semiconductor or analogous material.

In some embodiments, the IC dies disclosed herein may comprise substantially monocrystalline semiconductors, such as silicon or germanium, as a base material (e.g., substrate, body) on which integrated circuits are fabricated with traditional semiconductor processing methods. The semiconductor base material may include, for example, N-type pr P-type materials. Dies may include, for example, a crystalline base material formed using a bulk silicon (or other bulk semiconductor material) or a silicon-on-insulator (SOI) structure. In some other embodiments, the base material of one or more of the IC dies may comprise alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N, group III-V, group II-VI, or group IV materials. In yet other embodiments, the base material may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the base material may comprise an intrinsic IV or III-V semiconductor material or alloy, not intentionally doped with any electrically active impurity; in alternate embodiments, nominal impurity dopant levels may be present. In still other embodiments, dies may comprise a non-crystalline material, such as polymers; for example, the base material may comprise silica-filled epoxy. In other embodiments, the base material may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the base material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. Although a few examples of the material for dies are described here, any material or structure that may serve as a foundation (e.g., base material) upon which IC circuits and structures as described herein may be built falls within the spirit and scope of the present disclosure.

Unless described otherwise, IC dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of I/O functions, arithmetic operations, pipelining of data, etc.).

In another example, the terms "package" and "IC package" are synonymous, as are the terms "die" and "IC die." Note that the terms "chip," "die," and "IC die" are used interchangeably herein.

The term "optical structure" includes arrangements of forms fabricated in ICs to receive, transform and/or transmit optical signals as described herein. It may include optical conductors such as waveguides, electromagnetic radiation sources such as lasers and light-emitting diodes (LEDs) and electro-optical devices such as photodetectors.

In various embodiments, any photonic IC (PIC) described herein may comprise a semiconductor material including, for example, N-type or P-type materials. The PIC may include, for example, a crystalline base material formed using a bulk silicon (or other bulk semiconductor material) or a SOI structure (or, in general, a semiconductor-on-insulator structure). In some embodiments, the PIC may be formed using alternative materials, which may or may not be combined with silicon, that include, but are not limited to, lithium niobite, indium phosphide, silicon dioxide, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-N or group IV materials. In some embodiments, the PIC may comprise a non-crystalline material, such as polymers. In some embodiments, the PIC may be formed on a printed circuit board (PCB). In some embodiments, the PIC may be inhomogeneous, including a carrier material (such as glass or silicon carbide) as a base material with a thin semiconductor layer over which is an active side comprising transistors and like components. Although a few examples of the material for the PIC are described here, any material or structure that may serve as a foundation upon which the PIC may be built falls within the spirit and scope of the present disclosure.

The term "insulating" means "electrically insulating," the term "conducting" means "electrically conducting," unless otherwise specified. With reference to optical signals and/or devices, components and elements that operate on or using optical signals, the term "conducting" can also mean "optically conducting."

The terms "oxide," "carbide," "nitride," etc. refer to compounds containing, respectively, oxygen, carbon, nitrogen, etc.

The term "high-k dielectric" refers to a material having a higher dielectric constant than silicon oxide, while the term "low-k dielectric" refers to a material having a lower dielectric constant than silicon oxide.

The term "insulating material" or "insulator" (also called herein as "dielectric material" or "dielectric") refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon, silicon oxide, silicon carbide, silicon carbonitride, silicon nitride, and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

In various embodiments, elements associated with an IC may include, for example, transistors, diodes, power sources, resistors, capacitors, inductors, sensors, transceivers, receivers, antennas, etc. In various embodiments, elements associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed in a single IC die or as part of a chipset for executing one or more related functions in a computer.

In various embodiments of the present disclosure, transistors described herein may be field-effect transistors (FETs), e.g., MOSFETs. In many embodiments, an FET is a four-terminal device. In silicon-on-insulator, or nanoribbon, or gate all-around (GAA) FET, the FET is a three-terminal device that includes source, drain, and gate terminals and uses electric field to control current flowing through the device. A FET typically includes a channel material, a source region and a drain regions provided in and/or over the channel material, and a gate stack that includes a gate electrode material, alternatively referred to as a "work function" material, provided over a portion of the channel material (the "channel portion") between the source and the drain regions, and optionally, also includes a gate dielectric material between the gate electrode material and the channel material.

In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "lines," "wires," "metal lines" or "trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PCI. In such cases, the term "interconnect" may refer to optical waveguides, including optical fiber, optical splitters, optical combiners, optical couplers, and optical vias.

The term "waveguide" refers to any structure that acts to guide the propagation of light from one location to another location typically through a substrate material such as silicon or glass. In various examples, waveguides can be formed from silicon, doped silicon, silicon nitride, glasses such as silica (e.g., silicon dioxide or $SiO_2$), borosilicate (e.g., 70-80 wt % $SiO_2$, 7-13 wt % of $B_2O_3$, 4-8 wt % $Na_2O$ or $K_2O$, and 2-8 wt % of $Al_2O_3$) and so forth. Waveguides may be formed using various techniques including but not limited to forming waveguides in situ. For example, in some embodiments, waveguides may be formed in situ in glass using low temperature glass-to-glass bonding or by laser direct writing. Waveguides formed in situ may have lower loss characteristics.

The term "conductive trace" may be used to describe an electrically conductive element isolated by an insulating material. Within IC dies, such insulating material comprises interlayer low-k dielectric that is provided within the IC die. Within package substrates, and PCBs such insulating material comprises organic materials such as Ajinomoto Buildup Film (ABF), polyimides, or epoxy resin. Such conductive lines are typically arranged in several levels, or several layers, of metallization stacks.

The term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

The term "package substrate" may be used to describe any substrate material that facilitates the packaging together of any collection of semiconductor dies and/or other electrical components such as passive electrical components. As used herein, a package substrate may be formed of any material including, but not limited to, insulating materials such as resin impregnated glass fibers (e.g., PCB or Printed Wiring Boards (PWB)), glass, ceramic, silicon, silicon carbide, etc. In addition, as used herein, a package substrate may refer to a substrate that includes buildup layers (e.g., ABF layers).

The term "metallization stack" may be used to refer to a stack of one or more interconnects for providing connectivity to different circuit components of an IC die/chip and/or a package substrate.

As used herein, the term "pitch" of interconnects refers to a center-to-center distance between adjacent interconnects.

In context of a stack of dies coupled to one another or in context of a die coupled to a package substate, the term "interconnect" may also refer to, respectively, die-to-die (DTD) interconnects and die-to-package substrate (DTPS) interconnects. DTD interconnects may also be referred to as first-level interconnects (FLI). DTPS interconnects may also be referred to as Second-Level Interconnects (SLI).

Although not specifically shown in all of the present illustrations in order to not clutter the drawings, when DTD or DTPS interconnects are described, a surface of a first die may include a first set of conductive contacts, and a surface of a second die or a package substrate may include a second set of conductive contacts. One or more conductive contacts of the first set may then be electrically and mechanically coupled to some of the conductive contacts of the second set by the DTD or DTPS interconnects.

In some embodiments, the pitch of the DTD interconnects may be different from the pitch of the DTPS interconnects, although, in other embodiments, these pitches may be substantially the same.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some or all of the DTD interconnects in a microelectronic assembly or an IC package as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some metal-to-metal interconnects, a dielectric material (e.g., silicon oxide, silicon nitride, silicon carbide) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be bare (e.g., unpackaged) dies.

In some embodiments, the DTD interconnects may include solder. For example, the DTD interconnects may include conductive bumps or pillars (e.g., copper bumps or pillars) attached to the respective conductive contacts by solder. In some embodiments, a thin cap of solder may be used in a metal-to-metal interconnect to accommodate planarity, and this solder may become an intermetallic compound during processing. In some embodiments, the solder used in some or all of the DTD interconnects may have a higher melting point than the solder included in some or all of the DTPS interconnects. For example, when the DTD interconnects in an IC package are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth), tin, silver, bismuth, indium, indium and tin, or gallium.

In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In microelectronic assemblies or IC packages as described herein, some or all of the DTD interconnects may have a finer pitch than the DTPS interconnects. In some embodiments, the DTPS interconnects disclosed herein may have a pitch between about 80 microns and 300 microns, while the DTD interconnects disclosed herein may have a pitch between about 0.5 microns and 100 microns, depending on the type of the DTD interconnects. An example of silicon-level interconnect density is provided by the density of some DTD interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of dies and package substrates may result in differential expansion and contraction of the die dies and package substrates due to heat generated during operation (as well as the heat applied during various manufacturing operations). To mitigate damage caused by this differential expansion and contraction (e.g., cracking, solder bridging, etc.), the DTPS interconnects in any of the microelectronic assemblies or IC packages as described herein may be formed larger and farther apart than DTD interconnects, which may experience less thermal stress due to the greater material similarity of the pair of dies on either side of the DTD interconnects.

It will be recognized that one more levels of underfill (e.g., organic polymer material such as benzotriazole, imidazole, polyimide, or epoxy) may be provided in an IC package described herein and may not be labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity and chemical resistance, among other factors; in some embodiments, the choice of underfill material may be based on both design and processing considerations.

In some embodiments, one or more levels of solder resist (e.g., epoxy liquid, liquid photoimageable polymers, dry film photoimageable polymers, acrylics, solvents) may be provided in an IC package described herein and may not be labeled or shown to avoid cluttering the drawings. Solder resist may be a liquid or dry film material including photoimageable polymers. In some embodiments, solder resist may be non-photoimageable.

The terms "substantially," "close," "approximately," "near," and "about," generally refer to being within +/−20% of a target value (e.g., within +/−5% or 10% of a target value) based on the context of a particular value as described herein or as known in the art.

Terms indicating orientation of various elements, e.g., "coplanar," "perpendicular," "orthogonal," "parallel," or any other angle between the elements, generally refer to being within +/−5%-20% of a target value based on the context of a particular value as described herein or as known in the art.

The term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices.

The description uses the phrases "in an embodiment" or "in embodiments," which may each refer to one or more of the same or different embodiments.

Furthermore, the terms "comprising," "including," "having," and the like, as used with respect to embodiments of the present disclosure, are synonymous.

The disclosure may use perspective-based descriptions such as "above," "below," "top," "bottom," and "side"; such descriptions are used to facilitate the discussion and are not intended to restrict the application of disclosed embodiments.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

The term "dispose" as used herein refers to position, location, placement, and/or arrangement rather than to any particular method of formation.

The term "between," when used with reference to measurement ranges, is inclusive of the ends of the measurement ranges.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used herein, the notation "A/B/C" means (A), (B), and/or (C).

Although certain elements may be referred to in the singular herein, such elements may include multiple sub-elements. For example," an electrically conductive material" may include one or more electrically conductive materials. In another example, "a dielectric material" may include one or more dielectric materials.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Further, the singular and plural forms of the labels may be used with reference numerals to denote a single one and multiple ones respectively of the same or analogous type, species, or class of element.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

Note that in the figures, various components (e.g., interconnects) are shown as aligned (e.g., at respective interfaces) merely for ease of illustration; in actuality, some or all of them may be misaligned. In addition, there may be other components, such as bond pads, landing pads, metallization, etc. present in the assembly that are not shown in the figures to prevent cluttering. Further, the figures are intended to show relative arrangements of the components within their assemblies, and, in general, such assemblies may include other components that are not illustrated (e.g., various interfacial layers or various other components related to optical functionality, electrical connectivity, or thermal mitigation). For example, in some further embodiments, the assembly as shown in the figures may include more dies along with other electrical components. Additionally, although some components of the assemblies are illustrated in the figures as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

In the drawings, a particular number and arrangement of structures and components are presented for illustrative purposes and any desired number or arrangement of such structures and components may be present in various embodiments.

Further, unless otherwise specified, the structures shown in the figures may take any suitable form or shape according to material properties, fabrication processes, and operating conditions.

For convenience, if a collection of drawings designated with different letters are present (e.g., FIGS. 10A-10C), such a collection may be referred to herein without the letters (e.g., as "FIG. 10"). Similarly, if a collection of reference numerals designated with different letters are present (e.g., 112*a*-112*e*), such a collection may be referred to herein without the letters (e.g., as "112").

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Example Embodiments

FIG. 1 is a schematic cross-sectional view of an example microelectronic assembly 100 according to some embodiments of the present disclosure. Microelectronic assembly 100 comprises a package substrate 102 having a side 103 with an IC die 104 embedded between side 103 and opposing side 105 of package substrate 102. IC die 104 has TSVs 106. Package substrate 102 generally and IC die 104 in particular is conductively coupled by micro-vias 108 with one or more IC dies 110. Micro-vias 108 may have a diameter ranging between 5 micrometers and 55 micrometers, and may be spaced apart from each other with a pitch ranging between 5 micrometers and 55 micrometers. Some examples of IC dies 110 include stand-alone IC dies; other examples of IC dies 110 include stacked IC dies, including IC dies stacked on interposers. In some examples, IC die 110 may comprise an organic interposer to which is coupled another IC die 110 on a side of the interposer opposite to package substrate 102. The interposer may be an inorganic interposer in other examples, comprising inorganic materials such as silicon, glass and/or ceramic.

In various embodiments, package substrate 102 comprises a core 112 with buildup layers on either side of core 112. Each buildup layer includes an organic dielectric material 114 with a plurality of layers of conductive traces 116 therein. Conductive traces 116 may be conductively coupled by conductive vias through organic dielectric material 114. In some embodiments, organic dielectric material 114 is an epoxy material. In other embodiments, organic dielectric material 114 is a polyimide material. Examples of various organic dielectric materials suitable for use in package substrate 102 are listed in the previous subsection in reference to package substrates in general. Note that inorganic dielectric materials listed therein are not included in the choice of materials in various embodiments. The individual layers of the buildup layers are not shown or labeled with particularity in the figure merely for ease of illustration. Through-hole vias (THVs) 118 may be provisioned through core 112, for example, to conductively couple conductive traces 116 on either side of core 112. In some examples, package substrate 102 may be coreless, i.e., without core 112. In such examples, package substrate 102 may comprise only one set of buildup layers including plurality of layers of conductive traces 116 in organic dielectric material 114. In various embodiments, package substrate 102 may be configured to couple to a motherboard on side 105 of package substrate 102.

Figure 2:
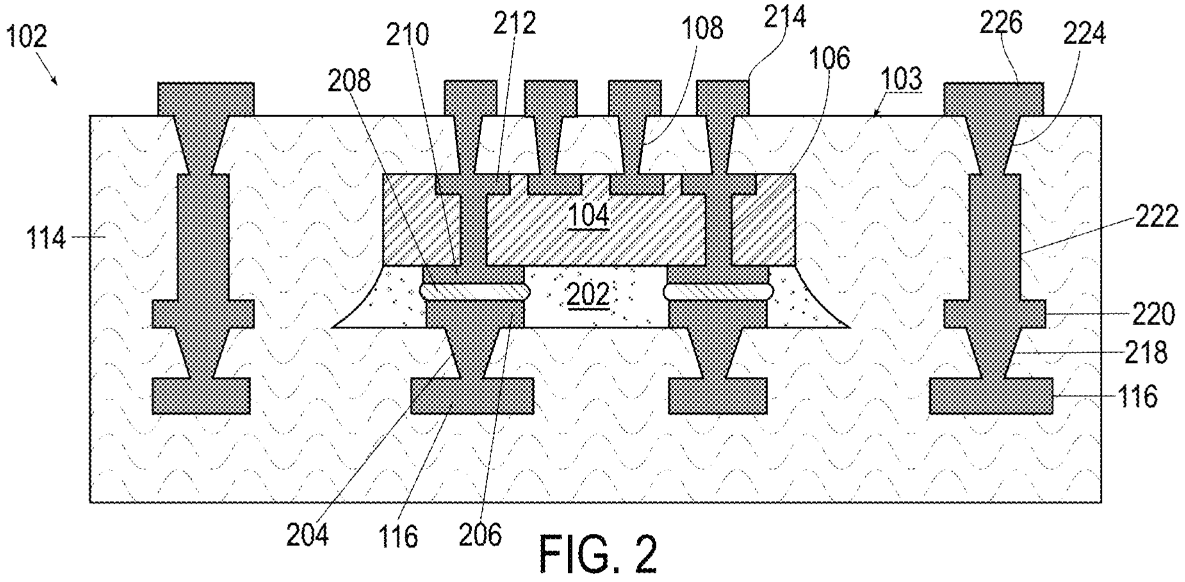
FIG. 2 is schematic cross-sectional view of a portion of the microelectronic assembly of FIG. 1.

FIG. 2 is schematic cross-sectional view of a portion of the microelectronic assembly 100 of FIG. 1, showing IC die 104 and nearby structures in greater detail. In various embodiments, package substrate 102 comprises an underfill material 202 in contact with IC die 104. In some embodiments, underfill material 202 may be an epoxy material, of the same or similar composition as organic dielectric material 114. In other embodiments, underfill material 202 may be different from organic dielectric material 114. Examples of underfill material 202 are listed in general the previous subsection. A conductive via 204 may conductively couple one or more conductive traces 116 with bond pads 206 in package substrate 102. In various embodiments, conductive vias 204 may have sizes ranging between 5 micrometers and 100 micrometers and may be spaced apart from each other with a pitch ranging between 5 micrometers and 300 micrometers. In some embodiments, bond pads 206 may be a subset of conductive traces 116. Bond pads 206 may be coupled by solder 208 with corresponding bond pads 210 in IC die 104. In various embodiments, underfill material 202 may provide thermo-mechanical stability and reliability to solder 208.

IC die 104 may comprise other bond pads 212 on an opposite side, with one or more TSVs 106 providing conductive coupling between some of bond pads 210 and 212. Bond pads 212 may be aligned with micro-vias 108 and may be conductively coupled by micro-vias to corresponding bond pads 214 on side 103 of package substrate 102. Some conductive traces 116 may be coupled by conductive vias 218 with bond pads 220. In various embodiments, conductive vias 218 may range in size between 10 micrometers and 100 micrometers and may be spaced apart from each other by a pitch between 10 micrometers and 200 micrometers. In some embodiments, bond pads 220 may be another subset of conductive traces 116. Conductive pillars 222 and conductive vias 224 through organic dielectric material 114 may conductively couple bond pads 220 with corresponding bond pads 226 on side 103 of package substrate 102. In some embodiments (as shown), package substrate may comprise, besides underfill material 202, organic dielectric material 114, between conductive traces 116 and surface (or side) 103; in other embodiments (not shown), at least another organic dielectric material besides underfill material 202 and organic dielectric material 114 may be present between conductive traces 116 and surface (e.g., side) 103. In some embodiments (not shown) solder resist material may be present around bond pads 214.

Figure 3:
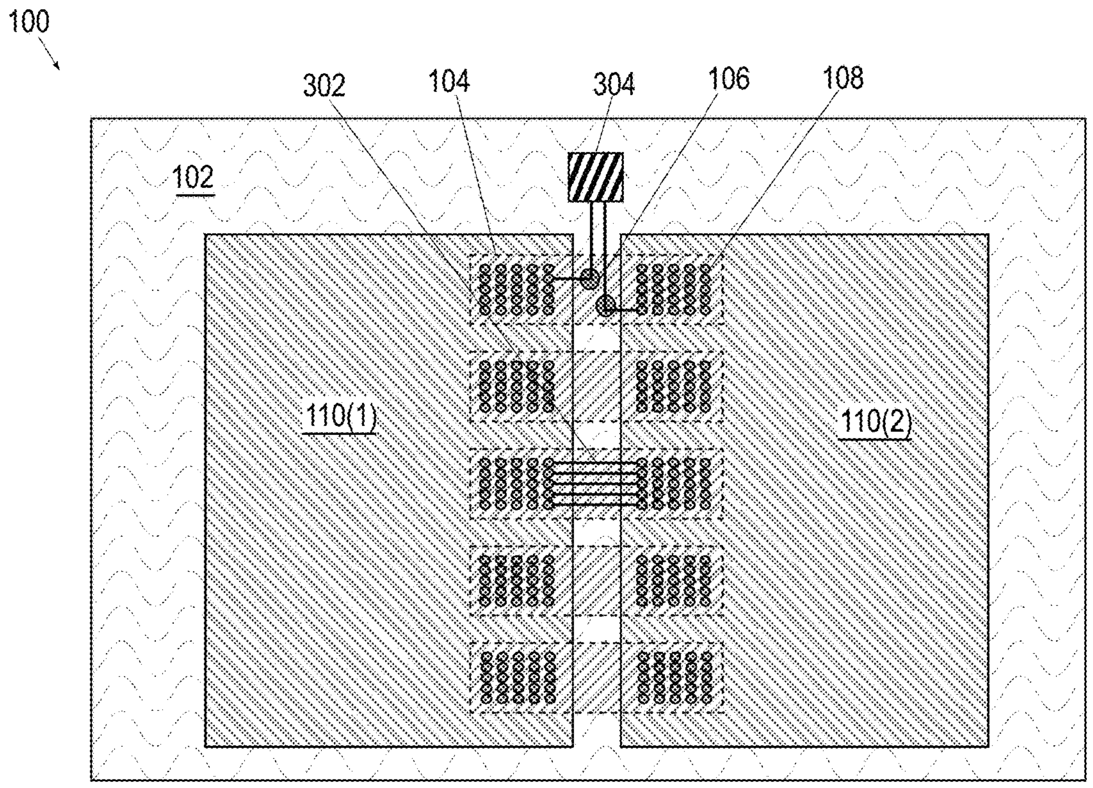
FIG. 3 is a schematic top view of a portion of an example microelectronic assembly according to some embodiments of the present disclosure.

FIG. 3 is a schematic top view of a portion of an example microelectronic assembly 100 according to some embodiments of the present disclosure. Some underlying features, namely IC dies 104, are shown in dotted lines merely for ease of explanation. Two IC dies 110(1) and 110(2) are adjacent each other on package substrate 102. IC dies 110(1) and 110(2) may be coupled by conductive pathways 302 through one or more IC dies 104 in package substrate 102. Conductive pathways 302 may comprise, in addition to conductive traces in IC dies 104, micro-vias 108 and interconnects (not labeled) between IC dies 104 and 110. A power delivery circuit 304 may be provisioned in package substrate 102. Power may be delivered to IC dies 110(1) and/or 110(2) from power delivery circuit 304 by way of TSVs 106 in IC dies 104. In other embodiments, TSVs 106 may also be used for other functionalities, such as for signal communication and/or ground connection.

In various embodiments, any of the features discussed with reference to any of FIGS. 1-3 herein may be combined with any other features to form a package with one or more IC dies as described herein. For example, in some microelectronic assemblies, some IC dies may be coupled by interconnects having solder and other IC dies may be coupled by hybrid bonds. Some such combinations are described above, but, in various embodiments, further combinations and modifications are possible. Various different embodiments described in different figures may be combined suitably based on particular needs within the broad scope of the embodiments.

Example Methods

Figure 4A:
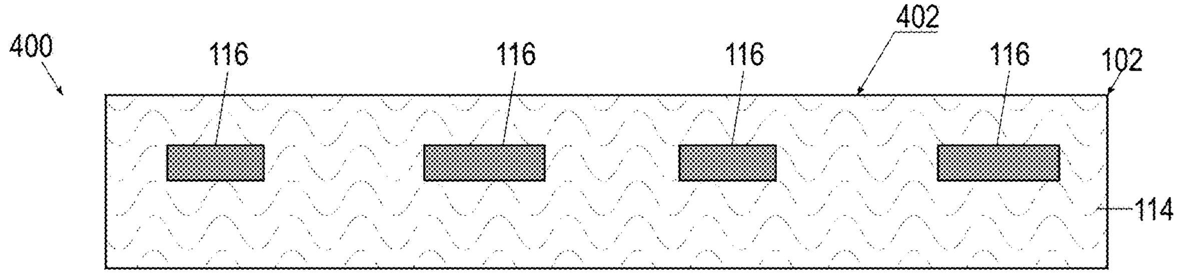
FIGS. 4A-4G are schematic cross-sectional views showing various stages of manufacture of an example microelectronic assembly according to some embodiments of the present disclosure.

FIGS. 4A-4G are schematic cross-sectional views of various stages of manufacture of microelectronic assembly 100 according to some embodiments of the present disclosure. FIG. 4A shows a portion 400 of package substrate 102 comprising a plurality of layers of conductive traces 116 in organic dielectric material 114. Note that in the figure, only one such layer is shown merely for ease of illustration. Further, other structures of package substrate 102 are not shown merely for ease of illustration, and not as limitations.

Figure 4B:
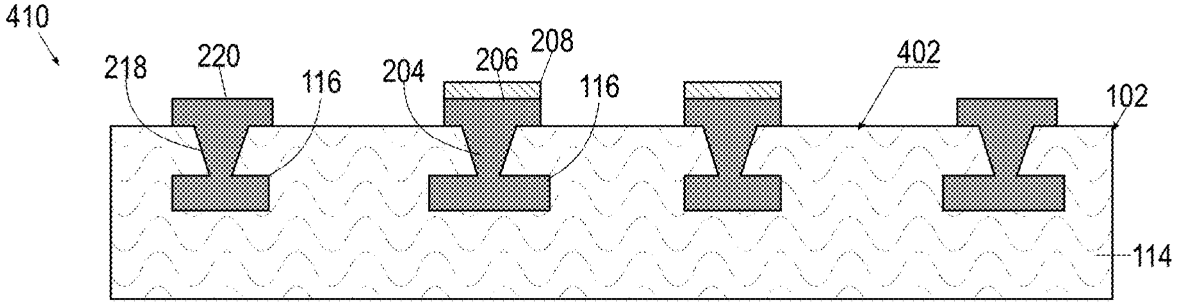

FIG. 4B shows an assembly 410 subsequent to forming conductive vias 204 and 218 through organic dielectric material 114 in surface 402 of package substrate 102 and depositing/patterning bond pads 206 and 220 over surface 402 aligned respectively with conductive vias 204 and 218. In some embodiments, conductive vias 204 and bond pads 206 may be formed before forming conductive vias 218 and bond pads 220. For example, conductive vias 204 may be formed by lithography process (e.g., etching vias in organic dielectric material 114 followed by electroplating conductive metal into the via to create conductive vias 204), followed by electroplating and patterning of bond pads 206 on surface 402 of package substrate 102. Subsequently, conductive vias 218 may be formed by laser drilling (or other non-lithography process) followed by electrodeposition and patterning of bond pads 220 on surface 402 of package substrate 102. In some embodiments, conductive vias 204 may be formed before conductive vias 218, whereas bond pads 206 and 220 may be formed simultaneously. In yet other embodiments, conductive vias 204 and 218 may be formed simultaneously as also bond pads 206 and 220. Solder 208, for example, in the form of solder paste may be deposited on bond pads 206.

Figure 4C:
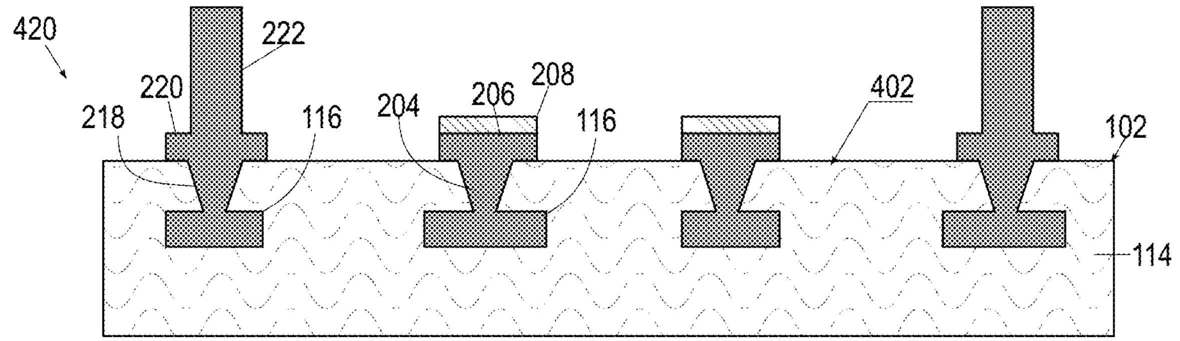

FIG. 4C shows an assembly 420 subsequent to forming conductive pillars 222 on bond pads 220 of assembly 410. In various embodiments, conductive pillars 222 may be formed by electrodeposition of copper on bond pads 220. In various embodiments, sufficient conductive material may be deposited such that the height of conductive pillars 222 is approximately more or equal to the height of IC die 104 after attachment to package substrate 102.

Figure 4D:
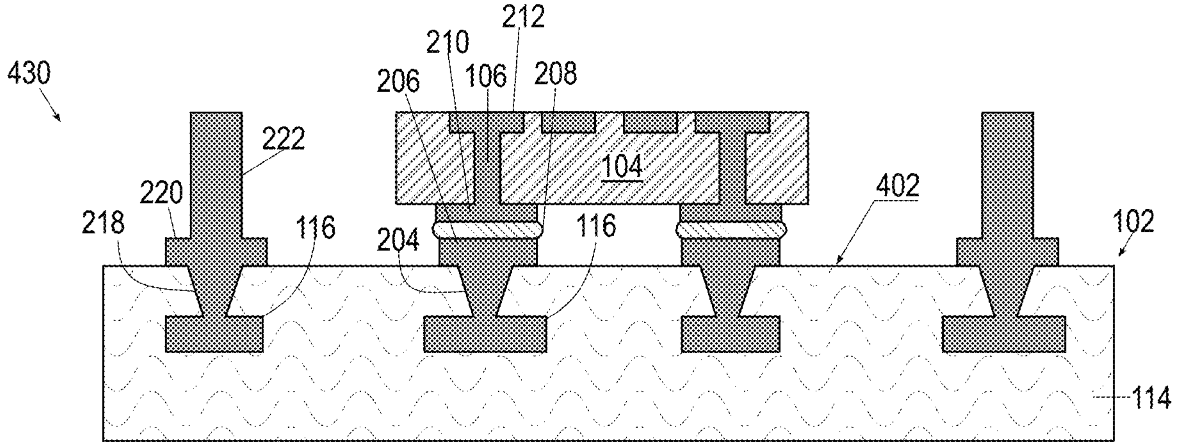

FIG. 4D shows an assembly 430 subsequent to attaching IC die 104 to bond pads 206 of assembly 420 using solder 208. In the embodiment shown, a solder reflow operation may be used to reflow solder 208, coupling together bond pads 206 and 210.

Figure 4E:
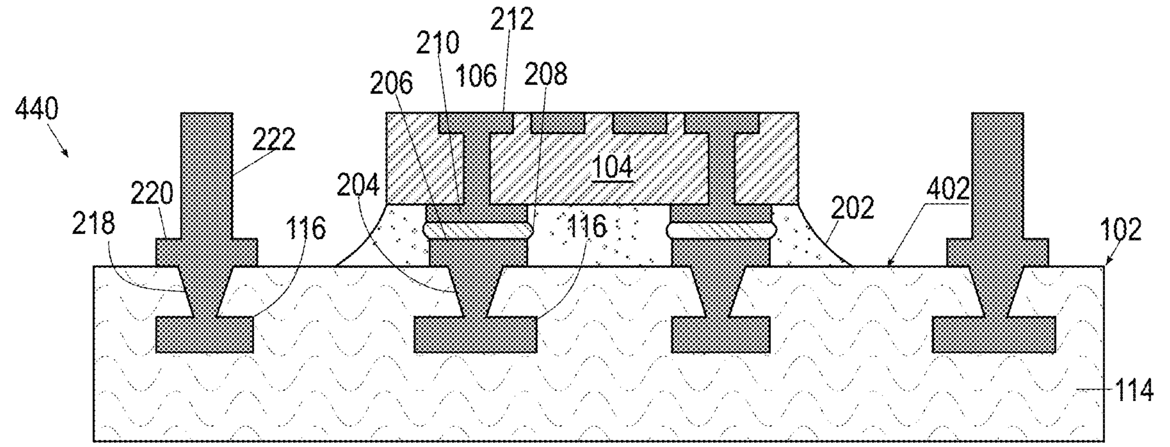

FIG. 4E shows an assembly 440 subsequent to depositing underfill material 202 around solder 208, between IC die 104 and surface 402 of package substrate 102. In some embodiments, underfill material 202 may be a non-conductive film. In other embodiments, underfill material 202 may be a liquid epoxy that may be cured by ultraviolet light or heat. Any suitable underfill material 202 may be used within the broad scope of the embodiments.

Figure 4F:
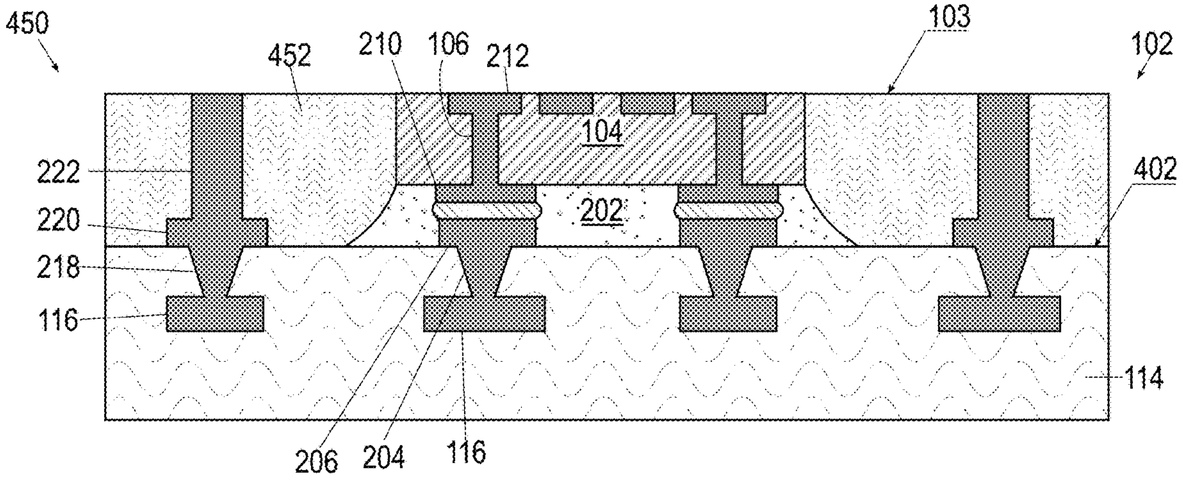

FIG. 4F shows an assembly 450 subsequent to depositing organic dielectric material 452 on surface 402 of package substrate 102, around IC die 104 and conductive pillars 222. In some embodiments, organic dielectric material 452 may be the same as or similar to organic dielectric material 114. In other embodiments, organic dielectric material 452 may be different from organic dielectric material 114. For example, in some embodiments, organic dielectric material 114 may be a polyimide material, and organic dielectric material 452 may be an epoxy material. In some embodiments, sufficient volume of organic dielectric material 452 may be deposited to cover the surface of IC die 104, for example, by approximately 3 micrometers. Subsequently, surface (e.g., side) 103 may be planarized until bond pads 212 on IC die 104 and conductive pillars 222 are revealed.

Figure 4G:
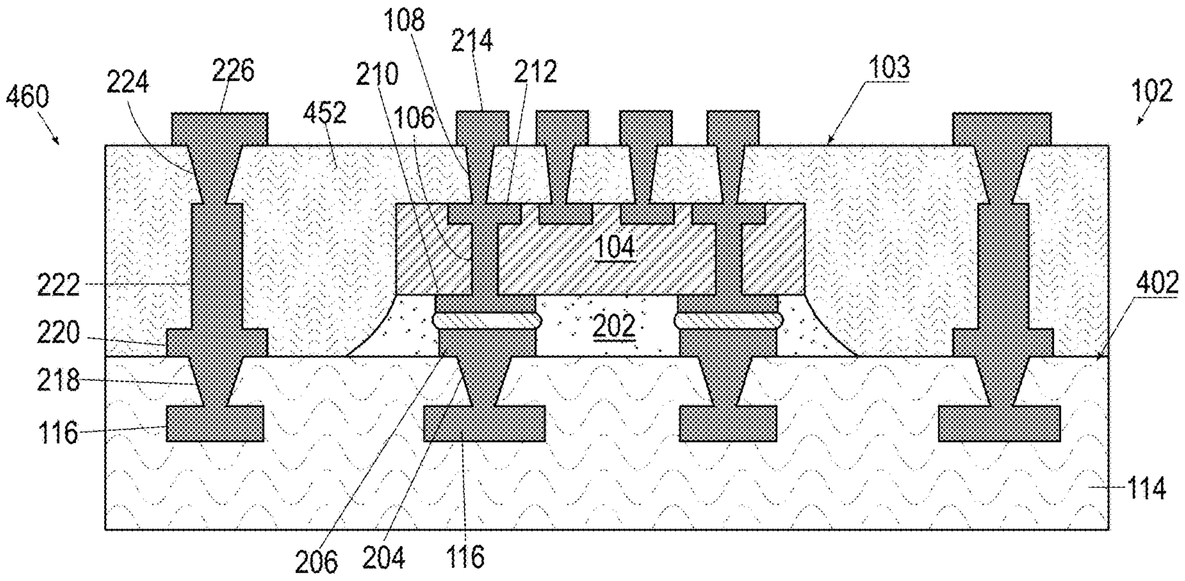

FIG. 4G shows an assembly 460 subsequent to forming micro-vias 108, conductive vias 224 and bond pads 214 and 226 on surface (e.g., side) 103 of package substrate 102. Micro-vias 108 and conductive vias 224 may be formed through organic dielectric material 452. In various embodiments, micro-vias 108 may be formed by laser drilling, as also conductive vias 224. In other embodiments, micro-vias 108 and conductive vias 224 may be formed by lithography processes. Bond pads 214 and 226 may be formed by electroplating and patterning appropriately as known in the art, aligned respectively with micro-vias 108 and conductive vias 224. In some embodiments, solder resist may be deposited around bond pads 214 and 226 subsequently and additional vias and bond pads formed as necessary to enable conductive coupling to other IC dies 110 (not shown).

Although FIG. 4 illustrates various operations performed in a particular order, this is simply illustrative and the operations discussed herein may be reordered and/or repeated as suitable. Further, additional processes which are not illustrated may also be performed without departing from the scope of the present disclosure. Also, various ones of the operations discussed herein with respect to FIG. 4 may be modified in accordance with the present disclosure to fabricate others of microelectronic assembly 100 disclosed herein. Although various operations are illustrated in FIG. 4 once each, the operations may be repeated as often as desired. For example, one or more operations may be performed in parallel to manufacture and test multiple microelectronic assemblies substantially simultaneously. In another example, the operations may be performed in a different order to reflect the structure of a particular microelectronic assembly in which one or more substrates or other components as described herein may be included.

Furthermore, the operations illustrated in FIG. 4 may be combined or may include more details than described. For example, the operations may be modified suitably without departing from the scope of the disclosure for IC dies that do not have a semiconductor substrate, but rather, are fabricated on other materials, such as glass or ceramic materials. Still further, the various operations shown and described may further include other manufacturing operations related to fabrication of other components of the microelectronic assemblies described herein, or any devices that may include the microelectronic assemblies as described herein. For example, the operations not shown in FIG. 4 may include various cleaning operations, additional surface planarization operations, operations for surface roughening, operations to include barrier and/or adhesion layers as desired, and/or operations for incorporating microelectronic assemblies as described herein in, or with, an IC component, a computing device, or any desired structure or device.

Example Devices and Components

Figure 5:
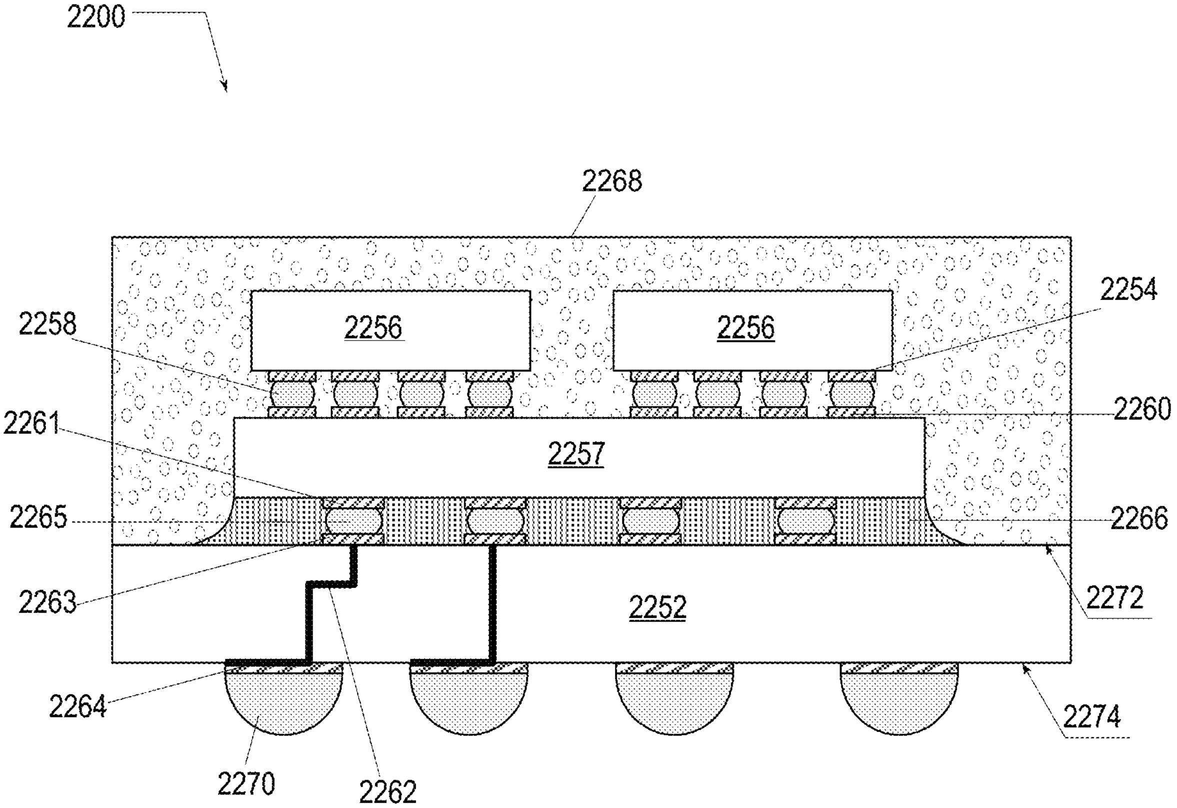
FIG. 5 is a cross-sectional view of a device package that includes one or more microelectronic assemblies in accordance with any of the embodiments disclosed herein.
Figure 6:
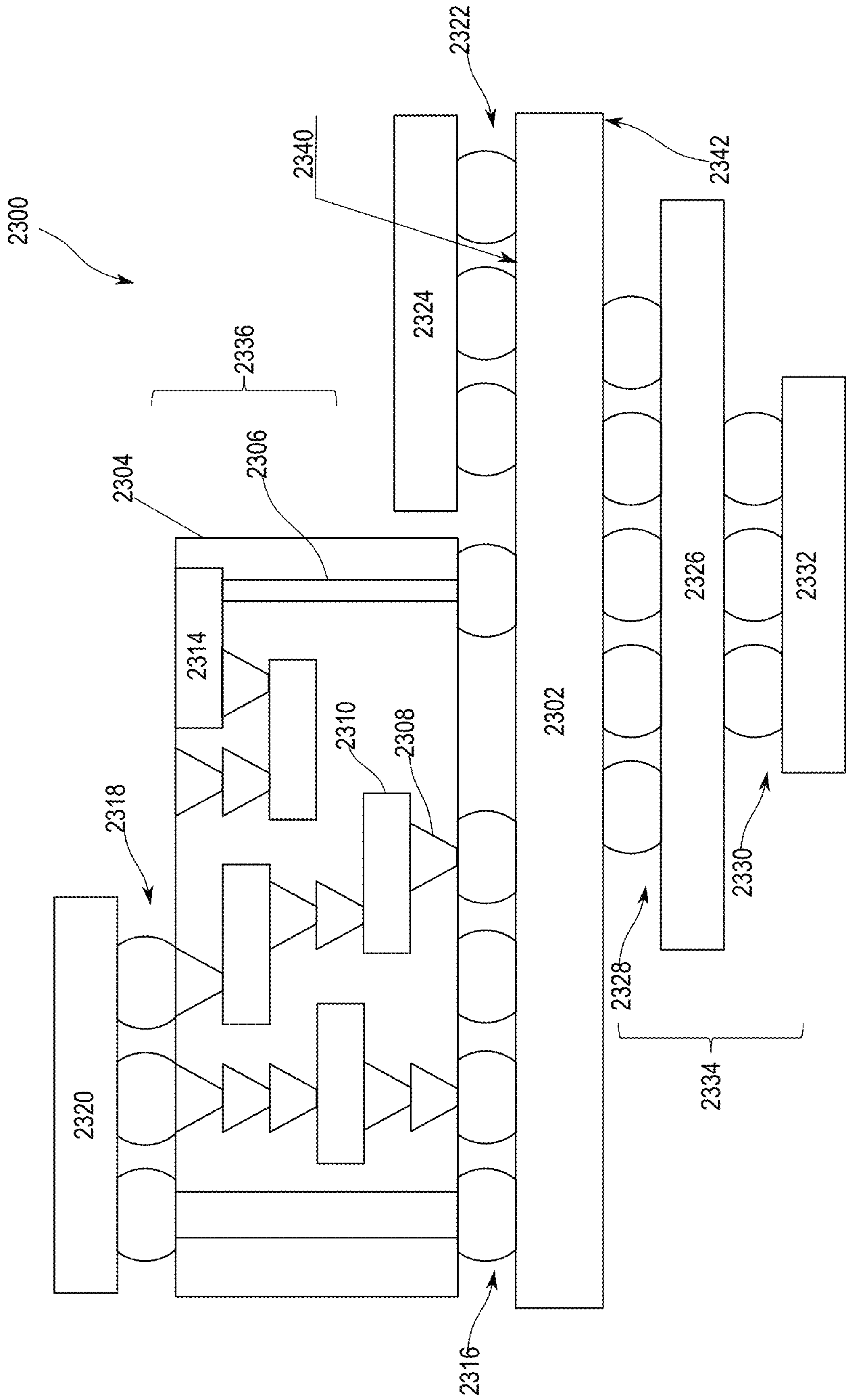
FIG. 6 is a cross-sectional side view of a device assembly that includes one or more microelectronic assemblies in accordance with any of the embodiments disclosed herein.
Figure 7:
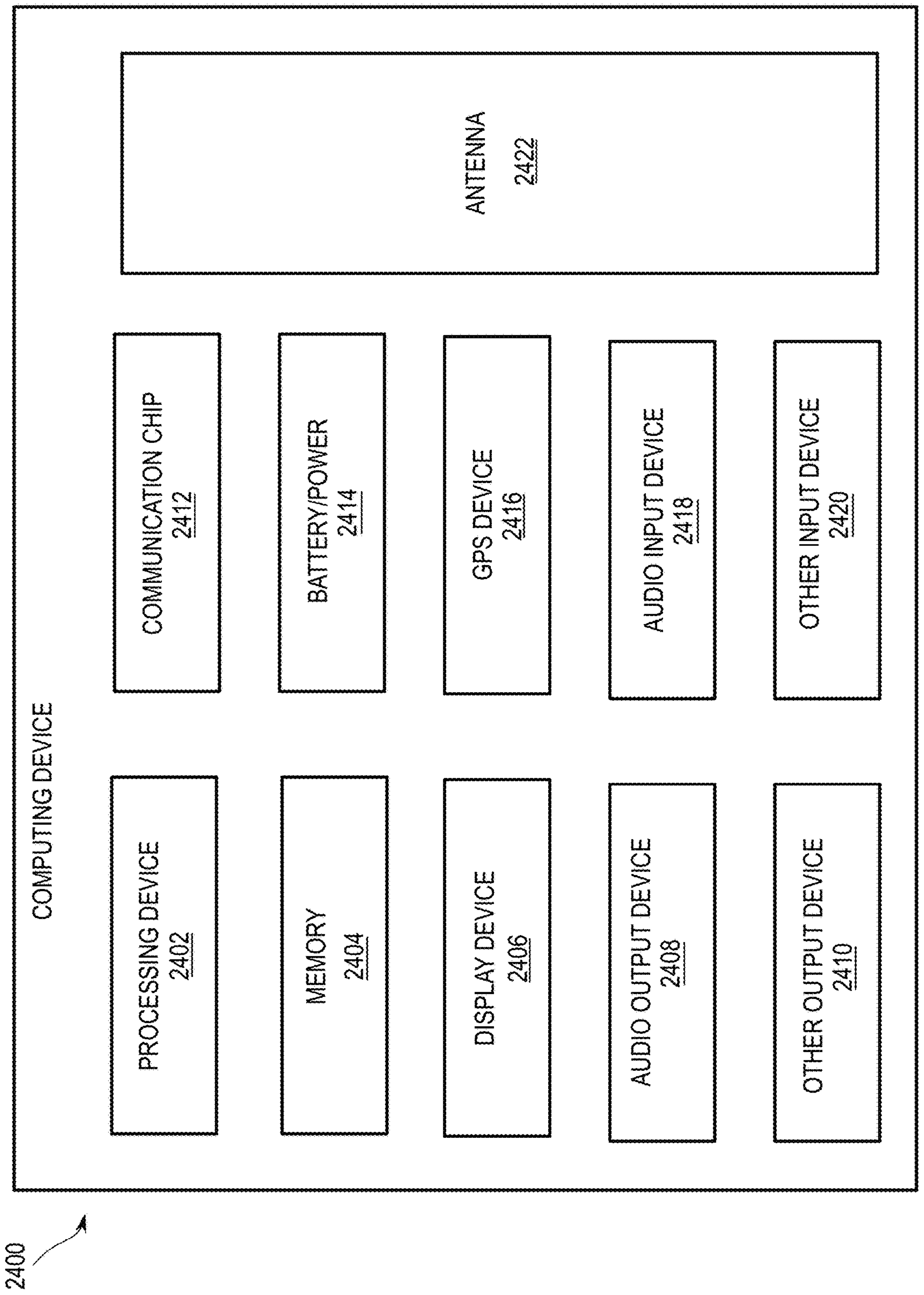
FIG. 7 is a block diagram of an example computing device that includes one or more microelectronic assemblies in accordance with any of the embodiments disclosed herein.

The packages disclosed herein, e.g., any of the embodiments shown in FIGS. 1-4 or any further embodiments described herein, may be included in any suitable electronic component. FIGS. 5-7 illustrate various examples of packages, assemblies, and devices that may be used with or include any of the IC packages as disclosed herein.

FIG. 5 is a side, cross-sectional view of an example IC package 2200 that may include IC packages in accordance with any of the embodiments disclosed herein. In some embodiments, the IC package 2200 may be a SiP.

As shown in the figure, package substrate 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias.

Package substrate 2252 may include conductive contacts 2263 that are coupled to conductive pathway 2262 through package substrate 2252, allowing circuitry within dies 2256 and/or interposer 2257 to electrically couple to various ones of conductive contacts 2264 (or to other devices included in package substrate 2252, not shown).

IC package 2200 may include interposer 2257 coupled to package substrate 2252 via conductive contacts 2261 of interposer 2257, first-level interconnects 2265, and conductive contacts 2263 of package substrate 2252. First-level interconnects 2265 illustrated in the figure are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in the figure are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package substrate 2252 and interposer 2257 around first-level interconnects 2265, and mold 2268 may be disposed around dies 2256 and interposer 2257 and in contact with package substrate 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in the figure are solder balls (e.g., for a ball grid array (BGA) arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 6.

In various embodiments, any of dies 2256 may be microelectronic assembly 100 as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 being microelectronic assembly 100 as described herein, one or more of dies 2256 may be logic dies (e.g., silicon-based dies), one or more of dies 2256 may be memory dies (e.g., HBM), etc. In some embodiments, any of dies 2256 may be implemented as discussed with reference to any of the previous figures. In some embodiments, at least some of dies 2256 may not include implementations as described herein.

Although IC package 2200 illustrated in the figure is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package substrate 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 6 is a cross-sectional side view of an IC device assembly 2300 that may include components having one or more microelectronic assembly 100 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more microelectronic assembly 100 in accordance with any of the embodiments disclosed herein; e.g., any of the IC packages discussed below with reference to IC device assembly 2300 may take the form of any of the embodiments of IC package 2200 discussed above with reference to FIG. 5.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package substrate.

As illustrated in the figure, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 15. In some embodiments, IC package 2320 may include at least one microelectronic assembly 100 as described herein. Microelectronic assembly 100 is not specifically shown in the figure in order to not clutter the drawing.

Although a single IC package 2320 is shown in the figure, multiple IC packages may be coupled to interposer 2304; indeed, additional interposers may be coupled to interposer 2304. Interposer 2304 may provide an intervening package substrate used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in the figure, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, ESD devices, and memory devices. More complex devices such as radio frequency (RF) devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 7 is a block diagram of an example computing device 2400 that may include one or more components having one or more IC packages in accordance with any of the embodiments disclosed herein. For example, any suitable ones of the components of computing device 2400 may include a microelectronic assembly (e.g., 100) in accordance with any of the embodiments disclosed herein. In another example, any one or more of the components of computing device 2400 may include any embodiments of IC package 2200 (e.g., as shown in FIG. 5). In yet another example, any one or more of the components of computing device 2400 may include an IC device assembly 2300 (e.g., as shown in FIG. 6).

A number of components are illustrated in the figure as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single SOC die.

Additionally, in various embodiments, computing device 2400 may not include one or more of the components illustrated in the figure, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more DSPs, ASICs, CPUs, GPUs, cryptoprocessors (specialized processors that execute cryptographic algorithms within hardware), server processors, or any other suitable processing devices. Computing device 2400 may include a memory 2404, which may itself include one or more memory devices such as volatile memory (e.g., dynamic random access memory (DRAM)), nonvolatile memory (e.g., read-only memory (ROM)), flash memory, solid-state memory, and/or a hard drive. In some embodiments, memory 2404 may include memory that shares a die with processing device 2402. This memory may be used as cache memory and may include embedded dynamic random access memory (eDRAM) or spin transfer torque magnetic random access memory (STT-M RAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), LTE project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

SELECT EXAMPLES

Example 1 provides a microelectronic assembly (e.g., 100, FIG. 1), comprising: a package substrate (e.g., 102) including a first IC die (e.g., 104) embedded therein; and a second IC die (e.g., 110) coupled to the package substrate and conductively coupled to the first IC die by conductive vias (e.g., 108) in the package substrate, the conductive vias having diameters less than 60 micrometers, in which: the package substrate has a first side (e.g., 103) and an opposing second side (e.g., 105), the second IC die is coupled to the first side of the package substrate, the first IC die is between the first side of the package substrate and the second side of the package substrate, the package substrate comprises a plurality of layers of conductive traces (e.g., 116) in an organic dielectric material (e.g., 114), the first IC die is surrounded by the organic dielectric material of the package substrate, the conductive vias are in the organic dielectric material between the first IC die and the first side of the package substrate, and the first IC die comprises TSVs (e.g., 106).

Example 2 provides the microelectronic assembly of example 1, in which (e.g., FIG. 2): a subset of the conductive traces in the package substrate comprises bond pads (e.g., 206) within the package substrate between the first side and the second side, and the first IC die is coupled to the bond pads by solder (e.g., 208).

Example 3 provides the microelectronic assembly of example 2, in which the package substrate further comprises an underfill material (e.g., 202) in contact with the first IC die between the first IC die and the bonds pads.

Example 4 provides the microelectronic assembly of example 3, in which the underfill material surrounds the solder.

Example 5 provides the microelectronic assembly of any one of examples 3-4, in which the underfill material is of a different composition than the organic dielectric material of the package substrate.

Example 6 provides the microelectronic assembly of any one of examples 2-5, in which the conductive vias are first conductive vias, the bond pads are coupled to other conductive traces by second conductive vias (e.g., 204).

Example 7 provides the microelectronic assembly of any one of examples 2-6, in which: the bonds pads in the package substrate comprise first bond pads, the first IC die comprises second bond pads (e.g., 210) corresponding to the first bond pads, and the solder is in contact with the first bond pads and the second bond pads.

Example 8 provides the microelectronic assembly of example 7, in which: the first IC die comprises third bond pads (e.g., 212) opposite to the second bond pads, the third bond pads are in contact with the first conductive vias.

Example 9 provides the microelectronic assembly of example 8, in which the TSVs conductively couple a subset of the second bond pads and another subset of the third bond pads.

Example 10 provides the microelectronic assembly of any one of examples 1-9, further comprising (e.g., FIG. 3) a third IC die coupled to the first side of the package substrate and laterally adjacent to the second IC die, in which: the third IC die is conductively coupled to the first IC die by the first conductive vias, conductive pathways (e.g., 302) between the second IC die and the third IC die are through the first IC die.

Example 11 provides the microelectronic assembly of example 10, in which: the package substrate further comprises a plurality of the first IC dies, and conductive pathways between the second IC die and the third IC die are through the plurality of the first IC dies.

Example 12 provides the microelectronic assembly of any one of examples 1-11, further comprising a power delivery circuit (e.g., 304) in the package substrate, in which the second IC die is conductively coupled to the power delivery circuit through the TSVs in the first IC die.

Example 13 provides the microelectronic assembly of any one of examples 1-12, in which the organic dielectric material comprises epoxy material.

Example 14 provides the microelectronic assembly of any one of examples 1-13, in which the package substrate further comprises solder resist between the first IC die and the second IC die.

Example 15 provides the microelectronic assembly of any one of examples 1-14, in which the second IC die comprises an interposer attached to a third IC die on a side of the interposer opposite to the package substrate.

Example 16 provides the microelectronic assembly of example 15, in which the interposer comprises another organic dielectric material.

Example 17 provides the microelectronic assembly of example 15, in which the interposer comprises an inorganic material selected from at least one of silicon, glass, and ceramic.

Example 18 provides the microelectronic assembly of any one of examples 1-17, in which: the organic dielectric material is a first organic dielectric material, the package substrate comprises another plurality of conductive traces in a second organic dielectric material, the first organic dielectric material is different from the second organic dielectric material, and the second organic dielectric material is between the first organic dielectric material and the second side of the package substrate.

Example 19 provides the microelectronic assembly of example 18, in which the first organic dielectric material is in contact with the second organic dielectric material.

Example 20 provides the microelectronic assembly of any one of examples 1-19, in which the package substrate further comprises a core between the first IC die and the second side of the package substrate.

Example 21 provides a package substrate (e.g., 102), comprising: a core (e.g., 112); buildup layers on either side of the core; and an IC die (e.g., 104) embedded in one of the buildup layers, an underfill material, in which: each buildup layer comprises a plurality of layers of conductive traces (e.g., 116) in an organic dielectric material (e.g., 114); a subset of the conductive traces between a surface of the package substrate and the core comprises bond pads (e.g., 206), the IC die is coupled to the bond pads by solder (e.g., 208), and the underfill material is between the IC die and the bond pads.

Example 22 provides the package substrate of example 21, further comprising conductive vias (e.g., 204) between the bond pads and another subset of the conductive traces.

Example 23 provides the package substrate of any one of examples 21-22 further comprising a plurality of conductive pillars (e.g., 222) in the organic dielectric material around the IC die.

Example 24 provides the package substrate of example 23, in which: the bond pads are first bond pads, the package substrate further comprises second bond pads (e.g., 226) on the surface of the package substrate, and the conductive pillars conductively couple the second bond pads with another subset of the conductive traces.

Example 25 provides the package substrate of example 24, in which the conductive vias are first conductive vias, the package substrate further comprises second conductive vias (e.g., 224) between the conductive pillars and the second bond pads, in which the second conductive vias conductively couple the conductive pillars and the second bond pads.

Example 26 provides the package substrate of any one of examples 24-25, further comprising third conductive vias (e.g., 218) between the conductive pillars and the another subset of the conductive traces, in which the third conductive vias conductively couple the conductive pillars and the another subset of the conductive traces.

Example 27 provides the package substrate of example 26, further comprising third bond pads (e.g., 220) between the third conductive vias and the conductive pillars.

Example 28 provides the package substrate of any one of examples 21-27, in which: the bond pads are first bond pads, the IC die comprises second bond pads (e.g., 210) coupled to the first bonds pads with the solder, and the IC die further comprises: third bond pads (e.g., 212) opposite to the second bond pads; and TSVs (e.g., 106) conductively coupling a subset of the second bond pads and another subset of the third bond pads.

Example 29 provides the package substrate of example 28, further comprising fourth bond pads (e.g., 214) corresponding to the third bond pads, in which: the fourth bond pads are on the surface of the package substrate, and the fourth bond pads are conductively coupled to the third bond pads by fourth conductive vias (e.g., 108) through the organic dielectric material between the surface of the package substrate and the IC die, the fourth conductive vias having diameters of less than 60 micrometers.

Example 30 provides the package substrate of example 29, further comprising solder resist around the fourth bond pads on the surface of the package substrate.

Example 31 provides the package substrate of example 30, in which the fourth conductive vias are further through the solder resist.

Example 32 provides the package substrate of any one of examples 30-31, in which the fourth bond pads are configured to be conductively coupled to another IC die.

Example 33 provides the package substrate of any one of examples 21-32, in which: the organic dielectric is a first epoxy material, the underfill material is a second epoxy material, and the first epoxy material is different from the second epoxy material.

Example 34 provides the package substrate of any one of examples 21-33, in which the underfill material is a non-conductive film.

Example 35 provides the package substrate of any one of examples 21-34, in which: the organic dielectric material is a first organic dielectric material, the buildup layer with the IC die further comprises another plurality of layers of conductive traces in a second organic dielectric material, the second organic dielectric material is between the first organic dielectric material and the core.

Example 36 provides the package substrate of example 35, in which the first organic dielectric material is an epoxy material, and the second organic dielectric material is a polyimide material.

Example 37 provides the package substrate of any one of examples 21-36, further comprising conductive THVs (e.g., 118) through the core, in which the THVs conductively couple conductive traces in the buildup layers on either side of the core.

Example 38 provides the package substrate of any one of examples 21-37, in which the package substrate is configured to be coupled to one or more IC dies on one side and to a motherboard on an opposing side.

Example 39 provides a method, comprising (e.g., FIG. 4): providing a package substrate having a plurality of layers of conductive traces in a first organic dielectric material, forming first conductive vias (e.g., 204) through the first organic dielectric material between a first surface (e.g., 402) of the package substrate and a subset of the conductive traces; patterning first bond pads (e.g., 206) on the first surface of the package substrate, the first bond pads aligned with the conductive vias; attaching an IC die to the bond pads with solder, the IC die comprising second bond pads on one side and third bond pads on an opposing side, the second bond pads being attached to the first bond pads with the solder; depositing underfill material around the solder between the IC die and the first surface of the package substrate; depositing a second organic dielectric material (e.g., 452) over the first surface of the package substrate and the IC die, generating a second surface of the package substrate corresponding to a surface of the second organic dielectric material; forming second conductive vias between the second surface (e.g., 103) of the package substrate and the third bond pads of the IC die; and patterning fourth bond pads over the second surface of the package substrate, the fourth bond pads aligned with the second conductive vias.

Example 40 provides the method of example 39, in which: the subset of the conductive traces is a first subset, and the method further comprises, before depositing the second organic dielectric material: forming third conductive vias (e.g., 218) through the first organic dielectric material between the first surface of the package substrate and a second subset of the conductive traces; patterning fifth bond pads (e.g., 220) on the first surface of the package substrate, the fifth bond pads aligned with the third conductive vias; and forming conductive pillars (e.g., 222) on the fifth bond pads.

Example 41 provides the method of example 40, in which the second organic dielectric material is deposited around the conductive pillars.

Example 42 provides the method of example 41, further comprising: forming fourth conductive vias through the second organic dielectric material between the second surface of the package substrate and the conductive pillars; and patterning sixth bond pads over the second surface of the package substrate, the sixth bond pads aligned with the fourth conductive vias.

Example 43 provides the method of any one of examples 39-42, in which the second organic dielectric material is same as or similar to the first organic dielectric material.

Example 44 provides the method of any one of examples 39-42, in which the second organic dielectric material is different from the first organic dielectric material.

Example 45 provides the method of any one of examples 39-44, in which the package substrate comprises a core and buildup layers on either side of the core.

Example 46 provides the method of any one of examples 39-45, further comprising depositing solder resist around the fourth bond pads.

Example 47 provides the method of any one of examples 39-46, further comprising coupling another IC die to the fourth bond pads.

Example 48 provides the method of any one of examples 39-47, in which attaching an IC die to the bond pads with solder comprises a solder reflow operation.

Example 49 provides the method of any one of examples 39-48, in which forming the first conductive vias through the first organic dielectric material comprises a lithography process.

Example 50 provides the method of any one of examples 39-48, in which forming the first conductive vias through the first organic dielectric material comprises a laser drilling process.

The above description of illustrated implementations of the disclosure, including what is described in the abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A microelectronic assembly, comprising:

a package substrate including a first integrated circuit (IC) die embedded therein; and a second IC die coupled with the package substrate and conductively coupled with the first IC die by conductive vias in the package substrate, wherein:

the package substrate has a first side and an opposing second side, the package substrate further comprises a core between the first IC die and the second side of the package substrate, the second IC die is coupled with the first side of the package substrate, the first IC die is between the first side of the package substrate and the second side of the package substrate, the package substrate comprises a plurality of layers of conductive traces in an organic dielectric material, the first IC die is surrounded by the organic dielectric material of the package substrate, and the conductive vias are in the organic dielectric material between the first IC die and the first side of the package substrate.

2. The microelectronic assembly of claim 1, wherein:

a subset of the conductive traces in the package substrate comprises bond pads within the package substrate between the first side and the second side, solder interconnects between the first IC die and the bond pads, the package substrate further comprises an underfill material in contact with the first IC die between the first IC die and the bonds pads, and the underfill material is of a different composition than the organic dielectric material of the package substrate.

3. The microelectronic assembly of claim 2, wherein:

the bonds pads in the package substrate comprise first bond pads, the first IC die comprises second bond pads corresponding to the first bond pads, and the solder interconnect in contact with the first bond pads and the second bond pads.

4. The microelectronic assembly of claim 3, wherein:

the first IC die comprises third bond pads opposite to the second bond pads, the third bond pads are in contact with the conductive vias, the first IC die comprises through-substrate vias (TSVs), and the TSVs are conductively coupled between a subset of the second bond pads and another subset of the third bond pads.

5. The microelectronic assembly of claim 1, further comprising a third IC die coupled with the first side of the package substrate and laterally adjacent to the second IC die, wherein:

the third IC die is conductively coupled with the first IC die by the conductive vias, conductive pathways between the second IC die and the third IC die are through the first IC die.

6. The microelectronic assembly of claim 5, wherein:

the package substrate further comprises a plurality of the first IC dies, and conductive pathways between the second IC die and the third IC die are through the plurality of the first IC dies.

7. The microelectronic assembly of claim 1, further comprising a power delivery circuit in the package substrate, wherein the first IC die comprises a through-substrate vias (TSV), and wherein the second IC die is conductively coupled with the power delivery circuit through the TSVs in the first IC die.

8. The microelectronic assembly of claim 1, wherein the second IC die comprises an interposer attached to a third IC die on a side of the interposer opposite to the package substrate.

9. A package substrate, comprising:

a core;

buildup layers on either side of the core;

an IC die embedded in one of the buildup layers; and an underfill material, wherein:

each buildup layer comprises a plurality of layers of conductive traces in an organic dielectric material, a subset of the conductive traces between a surface of the package substrate and the core comprises bond pads, the IC die is coupled with the bond pads by solder, and the underfill material is between the IC die and the bond pads.

10. The package substrate of claim 9, further comprising conductive vias between the bond pads and another subset of the conductive traces.

11. The package substrate of claim 10, further comprising a plurality of conductive pillars in the organic dielectric material around the IC die, wherein:

the bond pads are first bond pads, the package substrate further comprises second bond pads on the surface of the package substrate, and the plurality of conductive pillars are conductively coupled between the second bond pads and another subset of the conductive traces.

12. The package substrate of claim 11, wherein:

the conductive vias are first conductive vias, the package substrate further comprises second conductive vias between the conductive pillars and the second bond pads, and the second conductive vias are conductively coupled between the conductive pillars and the second bond pads.

13. The package substrate of claim 11, wherein:

the conductive vias are first conductive vias, the package substrate further comprises:

second conductive vias between the conductive pillars and the another subset of the conductive traces; and third bond pads between the second conductive vias and the conductive pillars, and the second conductive vias are conductively coupled between the conductive pillars and the another subset of the conductive traces.

14. The package substrate of claim 9, wherein:

the bond pads are first bond pads, the IC die comprises second bond pads coupled with the first bonds pads with the solder, and the IC die further comprises:

third bond pads opposite to the second bond pads; and through-substrate vias (TSVs) are conductively coupled between a subset of the second bond pads and another subset of the third bond pads.

15. The package substrate of claim 14, further comprising fourth bond pads corresponding to the third bond pads, wherein:

the fourth bond pads are on the surface of the package substrate, and the fourth bond pads are conductively coupled with the third bond pads by vias through the organic dielectric material between the surface of the package substrate and the IC die, the vias having a diameter of less than 60 micrometers.

16. The microelectronic assembly of claim 1, wherein the conductive vias having a diameter of less than 60 micrometers.

17. The microelectronic assembly of claim 16, wherein the first IC die comprises through-substrate vias (TSVs).

18. A microelectronic assembly, comprising:

a package substrate including a first integrated circuit (IC) die embedded therein; and a second IC die coupled with the package substrate and conductively coupled with the first IC die by conductive vias in the package substrate, wherein:

the package substrate has a first side and an opposing second side, the second IC die is coupled with the first side of the package substrate, the second IC die comprises an interposer attached to a third IC die on a side of the interposer opposite to the package substrate, the first IC die is between the first side of the package substrate and the second side of the package substrate, the package substrate comprises a plurality of layers of conductive traces in an organic dielectric material, the first IC die is surrounded by the organic dielectric material of the package substrate, and the conductive vias are in the organic dielectric material between the first IC die and the first side of the package substrate.

19. The microelectronic assembly of claim 18, wherein the conductive vias have a diameter of less than 60 micrometers.

20. The microelectronic assembly of claim 19, wherein the first IC die comprises through-substrate vias (TSVs).

* * * * *